(12) United States Patent
Van Zeijl et al.

(10) Patent No.: US 6,897,736 B2
(45) Date of Patent: May 24, 2005

(54) INTEGRATED HIGH-FREQUENCY MOS OSCILLATOR

(75) Inventors: Paulus Thomas Maria Van Zeijl, Hengelo (NL); Jurjen Tangenberg, Hardenberg (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/203,397

(22) PCT Filed: Feb. 12, 2001

(86) PCT No.: PCT/NL01/00115

§ 371 (c)(1),
(2), (4) Date: Apr. 8, 2003

(87) PCT Pub. No.: WO01/67604

PCT Pub. Date: Sep. 13, 2001

(65) Prior Publication Data

US 2004/0222860 A1 Nov. 11, 2004

(30) Foreign Application Priority Data

Feb. 14, 2000 (NL) .............................................. 1014377

(51) Int. Cl.[7] .................................................. H03B 5/00
(52) U.S. Cl. .............................. 331/117 R; 331/117 FE; 331/36 C; 331/177 V
(58) Field of Search ...................... 331/117 R, 117 FE, 331/177 V, 36 C

(56) References Cited

U.S. PATENT DOCUMENTS 6,545,555 B1 * 4/2003 Justice et al. ........... 331/117 R

FOREIGN PATENT DOCUMENTS

| DE | 3429574 A1 | 2/1986 |
|---|---|---|
| WO | PCT/NL01/00115 | 5/2001 |

OTHER PUBLICATIONS

Digital PLL Frequency Synthesizers, by Ulrich L. Rohde, 1983, Prentice Hall, pp. 142–143.*
"Synchronization of Tuned Inductor Capacitor Oscillators by Direct Injection," *IBM Technical Disclosure Bulletin,* U.S. IBM Corp, New York, vol. 40, No. 10, Oct., 1997, pp. 29–30, XP000739410.

* cited by examiner

*Primary Examiner*—Benny Lee
(74) *Attorney, Agent, or Firm*—Jenkens & Gilchrist, P.C.

(57) ABSTRACT

An integrated high-frequency MOS oscillator circuit comprising at least one active element (F1) and a frequency determining circuit, the oscillator circuit further comprising at least one frequency selective network (R1, C1) which is built up from one or more resistors and one or more reactive elements, such that the oscillation at the desired oscillator frequency can take place substantially unhampered, while oscillations at parasitic oscillation frequencies are suppressed in that at the parasitic oscillation frequencies the loop gain is reduced to an absolute value less than 1.

16 Claims, 1 Drawing Sheet

INTEGRATED HIGH-FREQUENCY MOS OSCILLATOR

The invention relates to an integrated high-frequency MOS oscillator circuit, comprising at least one active element and a frequency determining circuit.

Such oscillator circuits are already known and are typically, though not necessarily, implemented as balanced circuits. An example of such a MOS oscillator circuit implemented as a balanced circuit is described in IBM Technical Disclosure Bulletin Vol. 40, No. 10, October 1997.

MOS transistors are usually applied chiefly in technology controlling and determining circuits such as processors and memories. In this type of circuits, miniaturization, clock rate and cost price are the most important key issues. The pursuit of these key issues has also led to MOS transistors having become increasingly better useful for analog very high frequency circuits such as oscillators working far into the Gigahertz range. The MOS transistor, whose performance in the high-frequency signal processing area until recently was considerably poorer than that of the conventional bipolar transistor, now has comparable properties, but with less surface area used, which improves miniaturization. In addition, the low cost price is an advantage.

A problem occurring in modern integrated high-frequency oscillators built up with MOS transistors, however, is the occurrence of strong parasitic resonances at one or even more frequencies as a result of parasitic reactive impedances. These parasitic resonances can be far above the intended oscillator frequency, for instance in the range of 50 to 60 GHz. The danger exists that the oscillator circuit starts to oscillate at these higher frequencies, which is highly undesirable.

Accordingly, there is a need for an improved high-frequency oscillator circuit which does not have any parasitic oscillator frequencies and which can be built up using MOS elements, while substantially maintaining the good properties of the MOS technique.

The object of the invention is to provide for the need outlined and generally to make available a reliable MOS oscillator circuit which exhibits no or substantially no parasitic oscillations. To that end, according to the invention, an oscillator circuit of the above-described kind is characterized in that the oscillator circuit is further provided with at least one frequency selective network, which is built up from one or more resistors and one or more reactive elements, such that the oscillation at the desired oscillator frequency can take place substantially unhampered, while osillations at parasitic oscillation frequencies are suppressed in that at the parasitic oscillation frequencies the loop gain is reduced to an absolute value less than 1.

In the following, the invention is further described with reference to the appended drawing.

Figure 1:
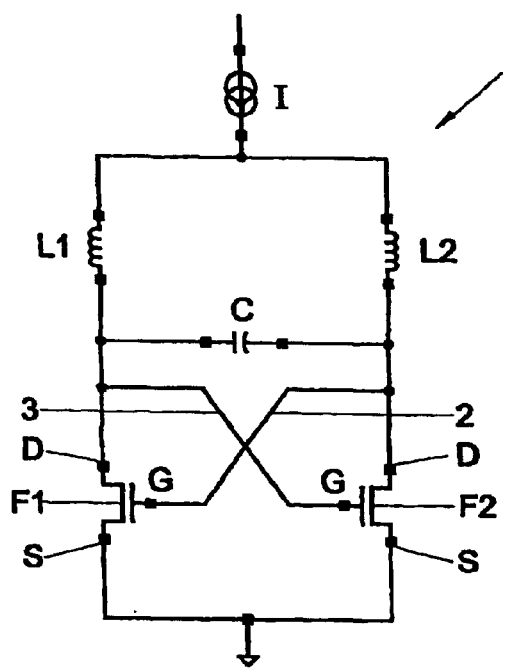

FIG. 1 schematically shows an example of a known oscillator circuit; and

Figure 2:
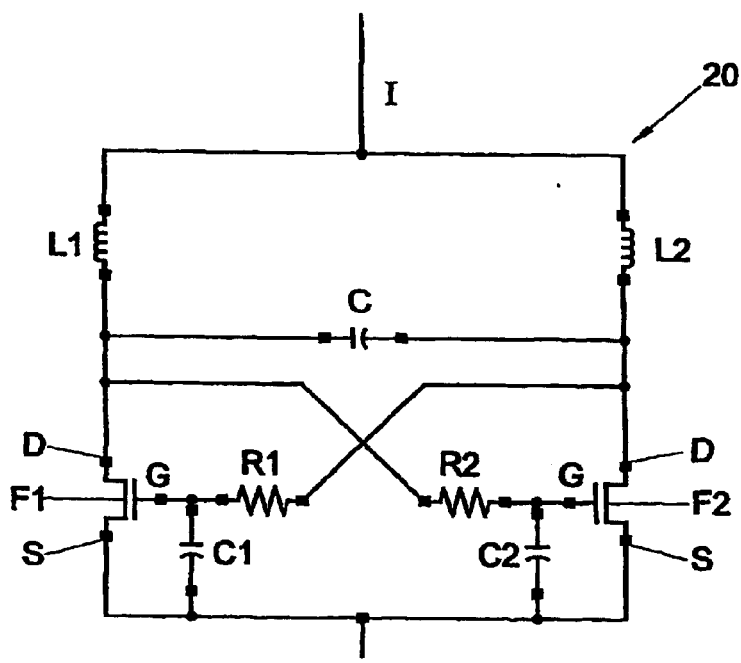

FIG. 2 schematically shows an example of an oscillator circuit according to the invention.

FIG. 1 schematically shows an example of a known integrated high-frequency oscillator circuit 1, in this case implemented as a balanced circuit. The oscillator circuit shown is built up using active MOS elements F1 and F2 which have been formed on a single chip. In this example, the elements F1 and F2 are of the FET type and each have three connecting electrodes designated D (drain), S (source) and G (gate). The two source electrodes are connected with each other. The gate and drain electrodes of the two elements F1 and F2 are crosswise connected with each other, in such a manner that the gate electrode of element F1 is connected, via a conductor 2 provided on the chip, with the drain electrode of the other element F2. Similarly, the gate electrode of element F2 is connected via a conductor 3 with the drain electrode of element F1.

Further, the two drain electrodes are connected with each other via a capacitor C formed on the chip, for instance a varactor. Each of the drain electrodes, finally, is connected with the end of an associated coil L1 and L2, respectively, formed on the chip, the other ends of the coils L1 and L2 being connected with each other and, directly or indirectly, with an energy source, in this example a power source I.

It is noted that the invention to be described hereinafter can be applied both in single-ended configurations and balanced configurations. An advantage of the use of a balanced configuration as shown is that signals of opposite phase occur therein. As a result, injection of oscillator signals in the substrate or pickup of noise signals from the substrate is suppressed.

In oscillator circuits of the above-described known type, as a result of parasitic impedances in the coil L1, L2 and/or the capacitor C, strong parasitic oscillation phenomena can arise at frequencies far above the intended oscillation frequency. Depending on the specific structure, this may even involve several parasitic resonance ranges. Such parasitic resonance ranges are highly undesirable because as a result of them the oscillator does not function in the intended manner.

FIG. 2 schematically shows an example of an oscillator circuit 20 according to the invention. In FIG. 2, corresponding elements are indicated with the same reference symbols as in FIG. 1. The circuit shown in FIG. 2 differs from that of FIG. 1 in that the gate electrodes are not connected with the drain electrodes of the other active elements directly but via a resistor R1 and R2, respectively. Further, the gate electrodes are each connected via a capacitor C1 and C2, respectively, to the associated source electrode and hence in this example are also grounded. In fact, between the gate electrode of one element and the drain electrode of the other element a respective RC network is connected. The RC network forms a first order low-pass filter which causes the loop gain to decrease with increasing frequency. The pole of the RC network is chosen such that the oscillation at the desired frequency is not influenced, but parasitic oscillation at higher frequencies is prevented.

It is noted that it is not always necessary to especially provide a resistance element and/or capacitive element. In some cases, depending on the circuit design, it may be possible to make use of an inherently present parasitic gate resistance and/or an inherently present parasitic gate-source capacitance, alone or in combination with an additional resistor or capacitor. The use of an additional part of the gate material as resistance is also possible. To that end, the MOS element can optionally be deliberately designed with a special architecture.

Further, it is possible to use differently structured frequency selective networks, which are included in the gate connections, as long as the loop gain is reduced as little as possible at the desired oscillation frequency and, conversely, to a sufficient extent at the parasitic frequencies. Such a frequency selective network can, if desired, comprise one or more coils but, in view of the dimensions of coils, is preferably built up only from resistance elements and capacitive elements. The circuit shown in FIG. 2 can also be realized using PMOS elements, besides NMOS elements.

After the foregoing, these and similar modifications will readily occur to one skilled in the art and are understood to fail within the scope of the invention.

What is claimed is:

1. An integrated high-frequency MOS oscillator circuit comprising:
   at least one active element;
   a frequency determining circuit; and
   wherein the oscillator circuit is further provided with at least one frequency selective network, which is built up from one or more resistors and one or more reactive elements, such that the oscillation at a desired oscillator frequency can take place substantially unhampered, while oscillations at parasitic oscillation frequencies are suppressed in that at the parasitic oscillation frequencies a loop gain is reduced to an absolute value less than 1.

2. The oscillator circuit according to claim 1, wherein the at least one frequency selective network comprises an RC network.

3. The oscillator circuit according to claim 1, wherein the at least one frequency selective network comprises at least one parasitic impedance of the at least one active element.

4. The oscillator circuit according to claim 1, wherein the at least one active element is a MOSFET with a gate electrode, a source electrode and a drain electrode and the frequency selective network comprises a resistor connected with the gate electrode and a capacitor arranged between the gate electrode and the source electrode.

5. The oscillator circuit according to claim 4, wherein the resistor and/or the capacitor can be at least partly formed by parasitic impedances.

6. The oscillator circuit according to claim 1, wherein the circuit is implemented as a balanced circuit with crosswise connections between the gate electrode of one active element and the drain electrode of another active element, while a respective frequency selective network is connected between the gate electrode of one active element and the drain electrode of the another active element.

7. The oscillator circuit according to claim 1, wherein the components of the frequency selective network are at least partly formed by giving a MOS element, in the manufacture thereof, a special architecture.

8. The oscillator circuit according to claim 2, wherein the RC network comprises a first order low pass filter.

9. An Integrated high-frequency oscillator circuit for suppressing parasitic oscillator frequencies, the circuit comprising:
   at least one active element, wherein the at least one active element comprises a gate electrode, a source electrode, and a drain electrode;
   a frequency determining circuit;
   at least one frequency selective network comprising at least one resistor and at least one reactive element; and
   wherein the frequency selective network further comprises the at least one resistor connected with the gate electrode and a capacitor arranged between the gate electrode and the source electrode.

10. The oscillator circuit of claim 9, wherein the at least one active element is a MOSFET.

11. The oscillator circuit of claim 9, wherein the resistor and/or the capacitor can be at least formed by parasitic impedances.

12. The oscillator circuit of claim 9, wherein the at least one frequency selective network comprises an RC network.

13. The oscillator circuit of claim 12, wherein the RC network comprises a first order low pass filter.

14. The oscillator circuit of claim 13, wherein the low pass filter causes a loop gain to decrease with increasing frequency.

15. The oscillator circuit of claim 8, wherein the at least one frequency selective network comprises at least one parasitic impedance of the at least one active element.

16. The oscillator circuit of claim 8, wherein the oscillator circuit is implemented as a balanced circuit with crosswise connections between the gate electrode of one active element and the drain electrode of another active element, while a respective frequency selective network is connected between the gate electrode of one active element and the drain electrode of the another active element.

* * * * *